(12) United States Patent
Lin

(10) Patent No.: US 9,046,306 B2
(45) Date of Patent: Jun. 2, 2015

(54) HEAT DISSIPATION DEVICE

(75) Inventor: Chih-Hsun Lin, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 709 days.

(21) Appl. No.: 13/216,194

(22) Filed: Aug. 23, 2011

(65) Prior Publication Data

US 2013/0014918 A1    Jan. 17, 2013

(30) Foreign Application Priority Data

Jul. 13, 2011  (TW) .............................. 100124711 A

(51) Int. Cl.
| | |
|---|---|
| H05K 7/20 | (2006.01) |
| F28D 15/02 | (2006.01) |
| F28F 1/10 | (2006.01) |
| F28F 1/32 | (2006.01) |
| H01L 23/367 | (2006.01) |
| H01L 23/427 | (2006.01) |

(52) U.S. Cl.
CPC .............. *F28D 15/0275* (2013.01); *F28F 1/10* (2013.01); *F28F 1/32* (2013.01); *H01L 23/3672* (2013.01); *H01L 23/427* (2013.01); *F28F 2210/08* (2013.01); *H01L 2924/0002* (2013.01)

(58) Field of Classification Search
USPC ............ 361/697, 700, 703; 165/79, 78, 80.3, 165/80.5, 104.33, 181, 182, 80.2
See application file for complete search history.

(56) References Cited

U.S. PATENT DOCUMENTS

| | | | | |
|---|---|---|---|---|
| 2,268,361 | A  * | 12/1941 | Walker et al. .................... | 165/82 |
| 6,076,594 | A  * | 6/2000 | Kuo .............................. | 165/80.3 |
| 6,847,525 | B1 * | 1/2005 | Smith et al. .................... | 361/703 |
| 7,697,298 | B2 * | 4/2010 | Chen .............................. | 361/719 |
| 7,710,724 | B2 * | 5/2010 | Takeguchi et al. ............. | 361/700 |
| D663,276 | S   * | 7/2012 | Lin .............................. | D13/179 |
| 8,267,159 | B2 * | 9/2012 | Yang et al. .................... | 165/80.3 |
| 8,395,898 | B1 * | 3/2013 | Chamseddine et al. ....... | 361/700 |
| 2003/0161102 | A1 * | 8/2003 | Lee et al. ...................... | 361/687 |
| 2005/0051297 | A1 * | 3/2005 | Kuo .............................. | 165/80.3 |
| 2005/0141198 | A1 * | 6/2005 | Lee et al. ...................... | 361/700 |
| 2005/0286232 | A1 * | 12/2005 | Chen et al. ..................... | 361/710 |
| 2006/0039113 | A1 * | 2/2006 | Cheng et al. ................... | 361/700 |
| 2006/0232933 | A1 * | 10/2006 | Wang et al. .................... | 361/697 |
| 2007/0029071 | A1 * | 2/2007 | Hwang et al. ............. | 165/104.33 |
| 2007/0068659 | A1 * | 3/2007 | Hwang et al. ................. | 165/121 |
| 2007/0256812 | A1 * | 11/2007 | Wei .............................. | 165/80.3 |
| 2008/0011454 | A1 * | 1/2008 | Hwang et al. ................. | 165/80.3 |
| 2008/0093056 | A1 * | 4/2008 | Hwang et al. ............. | 165/104.33 |
| 2008/0259565 | A1 * | 10/2008 | Iwata et al. .................... | 361/697 |
| 2008/0310122 | A1 * | 12/2008 | Chou et al. ..................... | 361/720 |
| 2009/0059525 | A1 * | 3/2009 | Peng et al. ..................... | 361/697 |

(Continued)

*Primary Examiner* — Marc Norman
*Assistant Examiner* — Max Snow
(74) *Attorney, Agent, or Firm* — Novak Druce Connolly Bove + Quigg LLP

(57) ABSTRACT

A heat dissipation device includes a plurality of fins connected to each other and two heat pipes extending through the fins. Each fin includes a plate, an upper flange extending from a top side of the plate, a lower flange extending from a bottom side of the plate and an inner flange extending from an inner periphery of a groove defined in the plate. The fins include first fins and second fins having lengths larger than that of the first fins. The two heat pipes include a wide heat pipe and a narrow heat pipe. The wide heat pipe extends through the grooves and contacts the inner flanges of the first fins and the second fins. The narrow heat pipe extends through the grooves and contacts the inner flanges of the second fins.

12 Claims, 6 Drawing Sheets

(56) References Cited

U.S. PATENT DOCUMENTS

| | | | |
|---|---|---|---|
| 2009/0135563 A1* | 5/2009 | Sakata | 361/697 |
| 2009/0229791 A1* | 9/2009 | Hung et al. | 165/80.3 |
| 2010/0002394 A1* | 1/2010 | Chen et al. | 361/700 |
| 2010/0195280 A1* | 8/2010 | Huang et al. | 361/679.47 |
| 2010/0258276 A1* | 10/2010 | Chen et al. | 165/104.26 |
| 2010/0258277 A1* | 10/2010 | Chen et al. | 165/104.26 |
| 2011/0146949 A1* | 6/2011 | Yang et al. | 165/67 |
| 2011/0277969 A1* | 11/2011 | Chang | 165/121 |
| 2012/0069521 A1* | 3/2012 | Hwang et al. | 361/697 |
| 2012/0160456 A1* | 6/2012 | Aoki | 165/104.26 |
| 2013/0056182 A1* | 3/2013 | Xia et al. | 165/104.34 |
| 2013/0168058 A1* | 7/2013 | Chamseddine et al. | 165/104.26 |

* cited by examiner

HEAT DISSIPATION DEVICE

BACKGROUND

1. Technical Field

The present disclosure relates to heat dissipation devices, and more particularly, to a heat dissipation device having heat pipes.

2. Description of Related Art

Electronic components generate a large amount of heat in operation thereof. Therefore, heat dissipation, often in the form of device, is required for the electronic components. A typical heat dissipation deice includes a plurality of fins connected to each other and a plurality of heat pipes extending through the fins. The heat pipes are uniformly inserted through each fin to conduct heat to the fins, which then dissipate the heat to a surrounding atmosphere.

However, the heat dissipation capability of the typical heat dissipation device is limited, and cannot meet heat dissipation requirement of high power electronic components.

What is needed, therefore, is a heat dissipation device which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
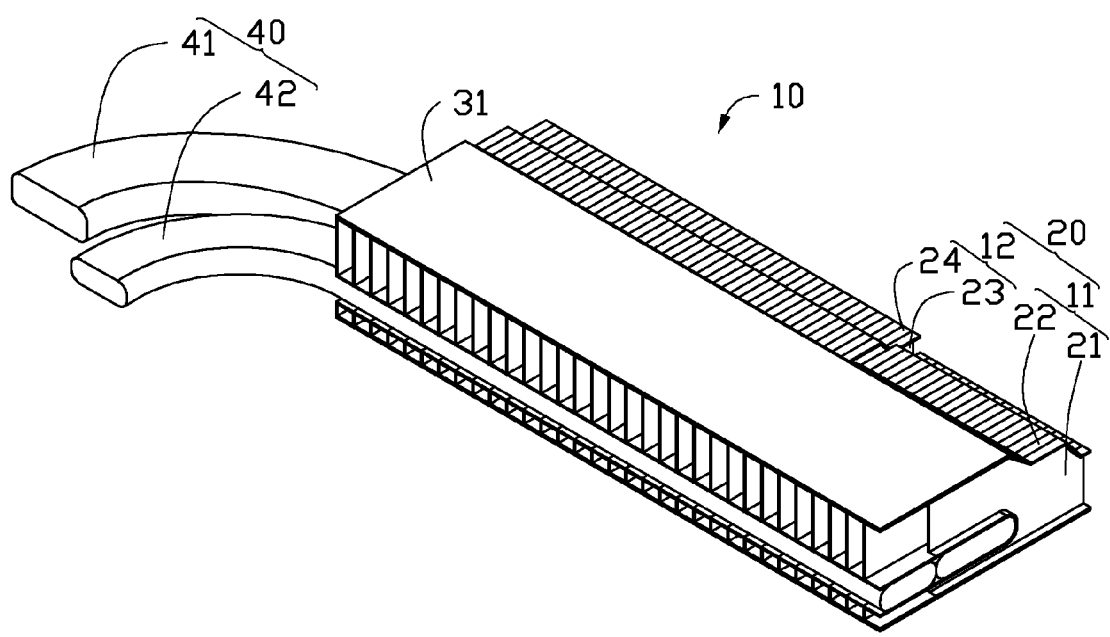
FIG. 1 is an isometric view of a heat dissipation device in accordance with an embodiment of the present disclosure.
Figure 2:
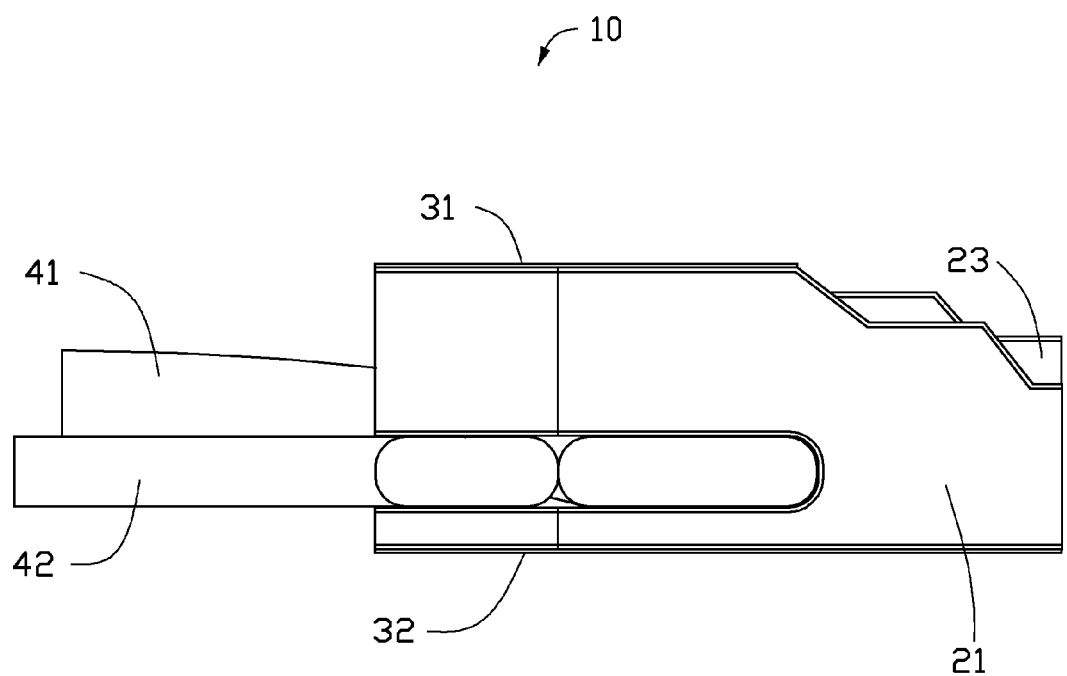
FIG. 2 is a front view of the heat dissipation device of FIG. 1.

Referring to FIGS. 1-2, a heat dissipation device 10 in accordance with an embodiment of the present disclosure is shown. The heat dissipation device 10 includes a plurality of fins 20 connected to each other, two heat pipes 40 extending through the fins 20, a cover 31 and a base 32 fixed to the fins 20.

Figure 3:
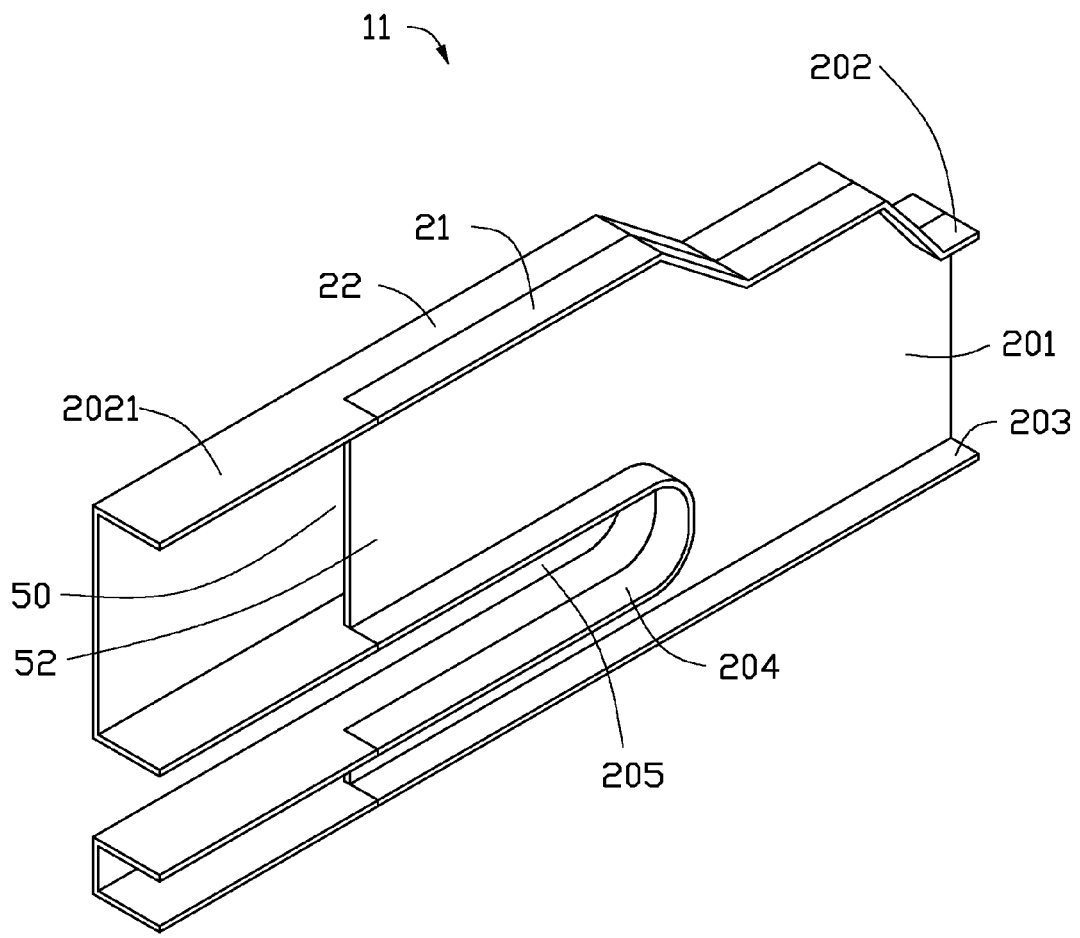
FIG. 3 is an enlarged view of a first fin assembly of the heat dissipation device of FIG. 1.
Figure 4:
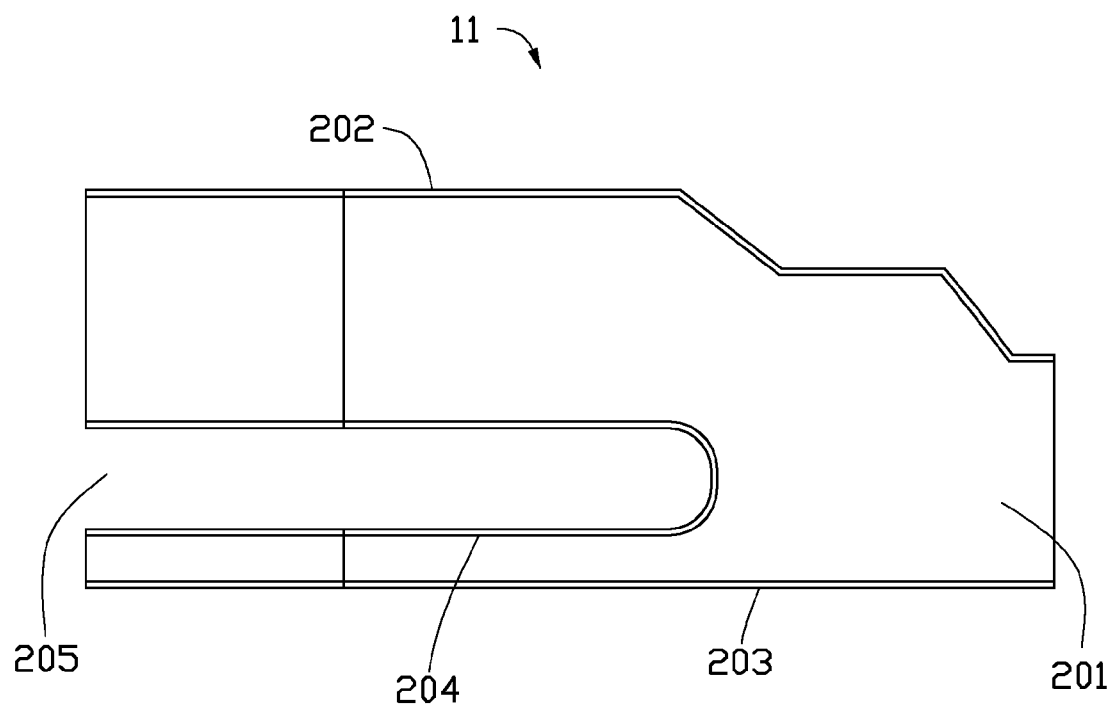
FIG. 4 is a front view of the first fin assembly of FIG. 3.
Figure 5:
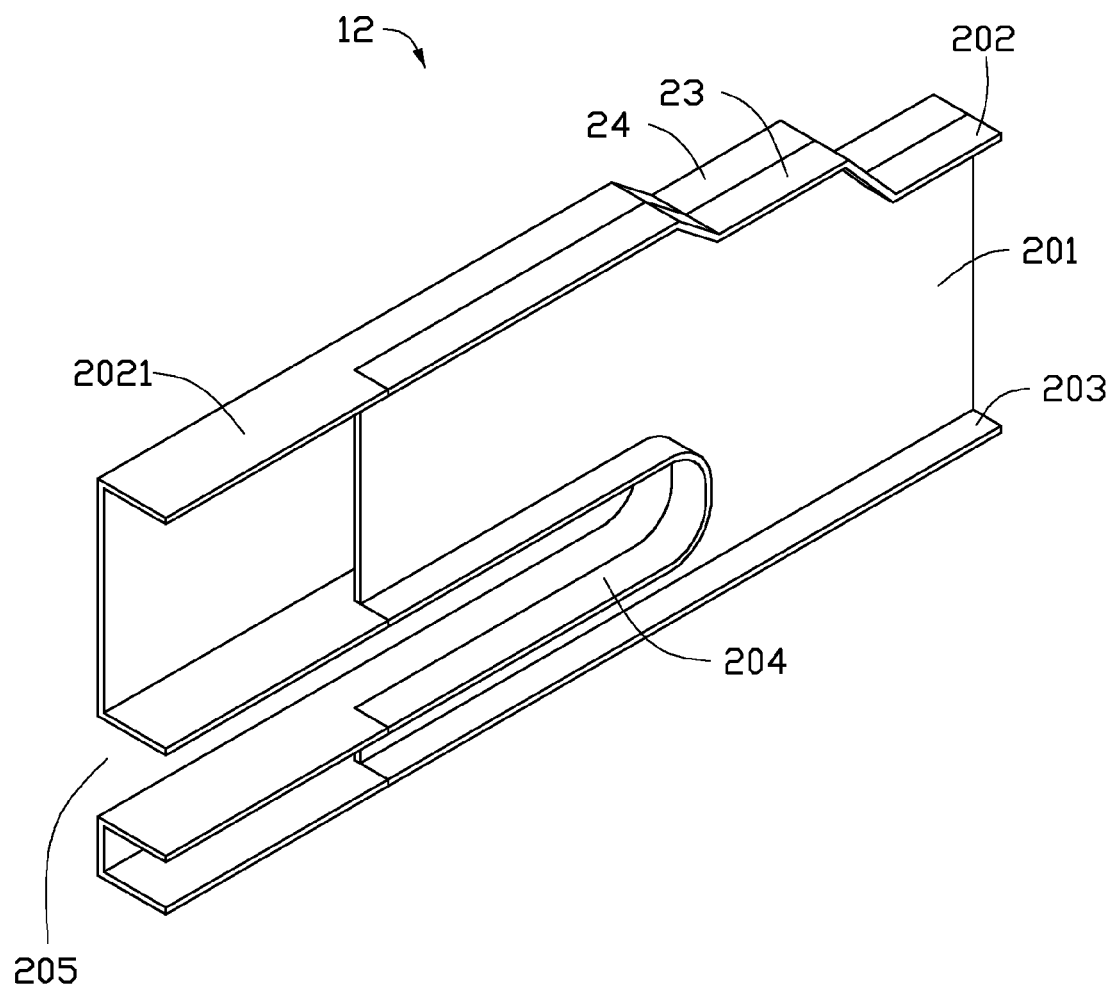
FIG. 5 is an enlarged view of a second fin assembly of the heat dissipation device of FIG. 1.
Figure 6:
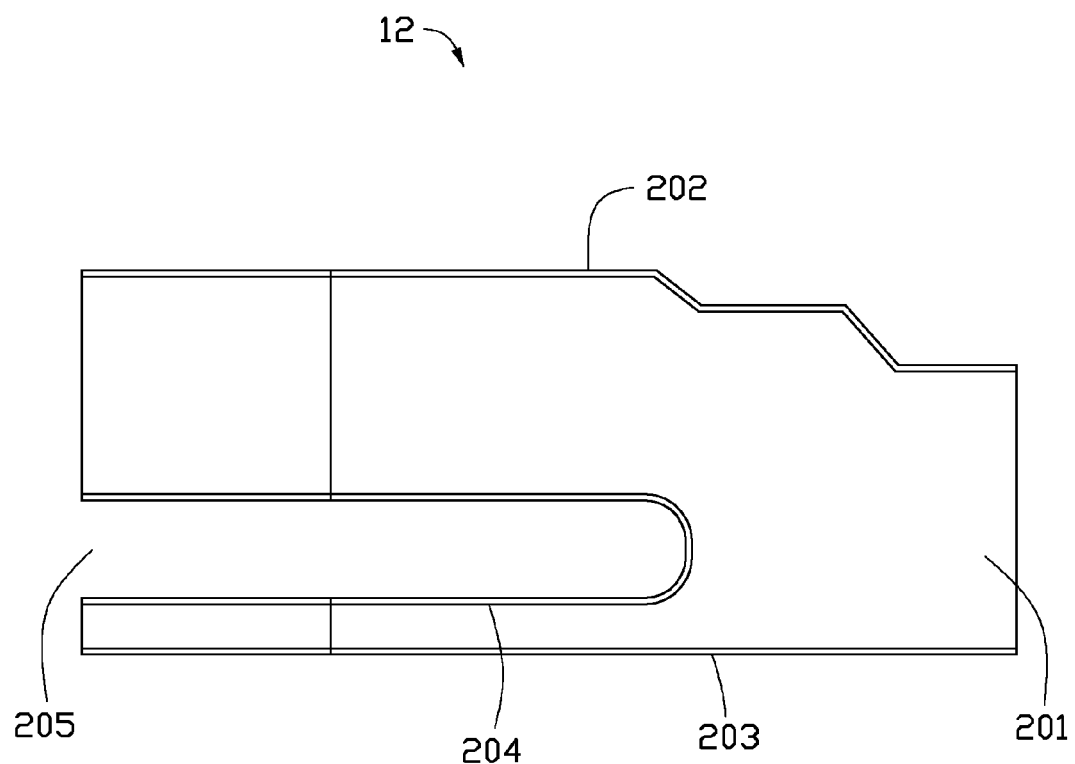
FIG. 6 is a front view of the second fin assembly of FIG. 5.

Also referring to FIGS. 3-4, the fins 20 include a plurality of first fin assemblies 11 and a plurality of second fin assemblies 12 connected to each other. Each first fin assembly 11 includes a first fin 21 and a second fin 22 coupled with the first fin 21. The first fin 21 includes a vertical plate 201, an upper flange 202 extending perpendicularly and horizontally from a top side of the plate 201 and a lower flange 203 extending perpendicularly and horizontally from a bottom side of the plate 201. The top side of the plate 201 forms two steps adjacent to a right side of the plate 201. The steps are sequentially descended towards the lower flange 203. The upper flange 202 conforms a profile of the top side of the plate 201 and is bended several times corresponding to the steps. The bottom side of the plate 201 is straight and the lower flange 203 is planar. The plate 201 of the first fin 21 defines a groove 205 in a left side thereof. The groove 205 has an open end at the left side of the plate 201 to communicate with an outside of the first fin 21 and a closed end terminated at an interior of the plate 201. The first fin 21 further forms an inner flange 204 along an outer periphery of the groove 205. The inner flange 204 has a U-shaped configuration and surrounds the groove 205. The inner flange 204 is located between the upper flange 202 and the lower flange 203. The inner flange 204, the upper flange 202 and the lower flange 203 have the same width.

The second fin 22 has a configuration similar to that of the first fin 21, also including a plate 201, an upper flange 202, a lower flange 203 and a inner flange 204. The plate 201, the upper flange 202, the lower flange 203 and the inner flange 204 of the second fin 22 are same as those of the first fin 21 except the lengths thereof. Each of the upper flange 202 and the lower flange 203 of the second fin 22 has a left end extending beyond that of the first fin 21. The inner flange 204 and the plate 201 of the second fin 22 each have two left ends extending beyond that of the first fin 21. The second fin 22 forms a tab 2021 horizontally and frontward extending from each left portion of the upper flange 202, the lower flange 203 and the inner flange 204. The tabs 2021 have width same as that of the lower flange 203, the upper flange 202 and the inner flange 204, respectively. The tabs 2021 are correspondingly juxtaposed with the lower flange 203, the inner flange 204 and the upper flange 202 of the first fin 21 so that the first fin 21 is embedded within the second fin 22. An airflow passage 50 is defined between the first fin 21 and the second fin 22 of each first fin assembly 11, and another airflow passage 52 is defined between the first fin 21 of each first fin assembly 11 and the second fin 22 of an adjacent first fin assembly 11. The two airflow passages 50, 52 are converged at the left ends of the second fin 22 extending beyond the first fin 21 and within a periphery of the second fin 22.

Each second fin assembly 12 includes a first fin 23 and a second fin 24. The first fin 23 and the second fin 24 of the second fin assembly 12 have the same configurations with that of the first fin 21 and the second fin 22 of the first assembly 11 except the steps. The steps of the second fin assembly 12 are higher than that of the first fin assembly 11, and the upper flanges 202 of the second fin assembly 12 also have corresponding right parts higher than that of the first fin assembly 11.

The heat pipes 40 include a first heat pipe 41 and a second heat pipe 42. The first heat pipe 41 has a cross section larger than that of the second heat pipe 42. In this embodiment, the first heat pipe 41 is wider than the second heat pipe 42, while has the same height as the second heat pipe 42. The first heat pipe 41 extends through and fills the grooves 205 of the first fins 21, 23 and right portions of the grooves 205 of the second fins 22, 24. The second heat pipe 42 just extends through and fills left portions of the grooves 205 of the second fins 22, 24. The first heat pipe 41 contacts the inner flanges 204 of the first fins 21, 23 and the second fins 22, 24, and the second heat pipe 42 just contacts the inner flanges 204 and the tabs 2021 of the second fins 22, 24.

Since the wide first heat pipe 41 having a higher heat conductivity contacts more fins 20, and the narrow second heat pipe 42 having a lower heat conductivity contacts less fins 20, a heat dissipation performance of the heat dissipation device 10 is optimized and raised.

It is believed that the present embodiments will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A heat dissipation device comprising:
a plurality of fins connected to each other;
a first heat pipe; and
a second heat pipe having a heat conductivity smaller than that of the first heat pipe, the first heat pipe contacting more fins than the second heat pipe;
wherein the plurality of fins comprise first fins and second fins different from the first fins;
wherein each second fin has an area larger than that of the each first fin;
wherein each second fin is longer than each first fin;
wherein the first heat pipe contacts the first fins and the second fins, and the second heat pipe contacts the second fins but not the first fins; and
wherein each of the first fins and the second fins comprises a plate defining a groove therein, the first heat pipe extending through the grooves of the first fins and the second fins, and the second heat pipe extending through the same grooves of the second fins.

2. The heat dissipation device of claim 1, wherein each of the first fins and the second fins comprises an inner flange formed on an inner circumferential periphery of the groove thereof, the first heat pipe contacting the inner flanges of the first fins and the second fins, and the second heat pipe contacting the inner flanges of the second fins.

3. The heat dissipation device of claim 2, wherein the inner flange of each second fin has a portion extending beyond the inner flange of each first fin, the second heat pipe contacting the portions of the inner flanges of the second fins extending beyond the inner flanges of the first fins.

4. The heat dissipation device of claim 2, wherein the groove has an open end communicating with an outside of the plate and a closed end terminated within the plate.

5. The heat dissipation device of claim 4, wherein the inner flange has a U-shaped configuration.

6. The heat dissipation device of claim 3, wherein each of the first fins and the second fins comprises an upper flange extending from a top side of the plate and a lower flange extending from a bottom side of the plate thereof.

7. The heat dissipation device of claim 6, wherein the upper flange and the lower flange of each second fin have portions extending beyond each first fin.

8. The heat dissipation device of claim 7, wherein each second fin forms a tab from each portion of the upper flange, the lower flange and the inner flange thereof extending beyond the upper flange, the lower flange and the inner flange of each first fin, respectively.

9. The heat dissipation device of claim 8, wherein the second heat pipe contacts the tabs.

10. The heat dissipation device of claim 8, wherein each tab has a width same as that of the upper flange, the lower flange and the inner flange of each first fin.

11. The heat dissipation device of claim 10, wherein the tabs of each second fin are juxtaposed with the upper flange, the lower flange and the inner flange of an adjacent first fin.

12. The heat dissipation device of claim 11, wherein each first fin is embedded within an adjacent second fin.

* * * * *